United States Patent
Ding

(10) Patent No.: US 8,462,906 B1
(45) Date of Patent: Jun. 11, 2013

(54) APPARATUS AND METHODS FOR DETECTION AND CORRECTION OF TRANSMITTER DUTY CYCLE DISTORTION

(75) Inventor: Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 113 days.

(21) Appl. No.: 13/234,062

(22) Filed: Sep. 15, 2011

(51) Int. Cl.
*H04L 7/00* (2006.01)

(52) U.S. Cl.
USPC ........... 375/355; 375/226; 375/276; 375/326; 375/219; 375/375; 327/175; 327/218; 327/231; 327/122; 327/172; 398/9; 398/23; 398/24; 398/25; 341/101

(58) Field of Classification Search
USPC ................ 375/376, 226, 224, 373, 371, 221, 375/340, 219, 375, 355, 326; 327/122, 172, 327/218, 231, 175, 407; 398/9–25, 182; 341/101

See application file for complete search history.

(56) References Cited

U.S. PATENT DOCUMENTS

| | | | |
|---|---|---|---|
| 5,969,545 A | 10/1999 | Assadian et al. | |
| 6,148,038 A * | 11/2000 | Drost et al. | 375/324 |
| 6,331,999 B1 * | 12/2001 | Ducaroir et al. | 375/226 |
| 6,603,348 B1 | 8/2003 | Preuss et al. | |
| 6,900,663 B1 | 5/2005 | Roper et al. | |
| 6,900,681 B2 * | 5/2005 | Takano | 327/175 |
| 7,038,502 B2 | 5/2006 | Yamaguchi | |
| 7,053,712 B2 | 5/2006 | Bonaccio et al. | |
| 7,179,952 B2 * | 2/2007 | Vukos et al. | 604/378 |
| 7,298,807 B2 * | 11/2007 | Zerbe et al. | 375/355 |
| 7,496,155 B1 * | 2/2009 | Lu et al. | 375/326 |
| 7,514,968 B1 | 4/2009 | Lai et al. | |
| 8,125,259 B2 * | 2/2012 | Dai et al. | 327/175 |
| 8,243,868 B2 * | 8/2012 | Zhang et al. | 375/371 |
| 2009/0154591 A1 | 6/2009 | Wong et al. | |
| 2009/0290626 A1 * | 11/2009 | Thurston et al. | 375/224 |
| 2012/0256670 A1 * | 10/2012 | Ding et al. | 327/175 |

* cited by examiner

*Primary Examiner* — Lam T Mai

(74) *Attorney, Agent, or Firm* — Okamoto & Benedicto LLP

(57) ABSTRACT

One embodiment relates to an integrated circuit which includes a transmitter buffer circuit, a duty cycle distortion (DCD) detector, correction logic, and a duty cycle adjuster. The DCD detector is configured to selectively couple to the serial output of the transmitter buffer circuit. The correction logic is configured to generate control signals based on the output of the DCD detector. The duty cycle adjuster is configured to adjust a duty cycle of the serial input signal based on the control signals. Another embodiment relates to a method of correcting duty cycle distortion in a transmitter. Other embodiments and features are also disclosed.

22 Claims, 17 Drawing Sheets

150

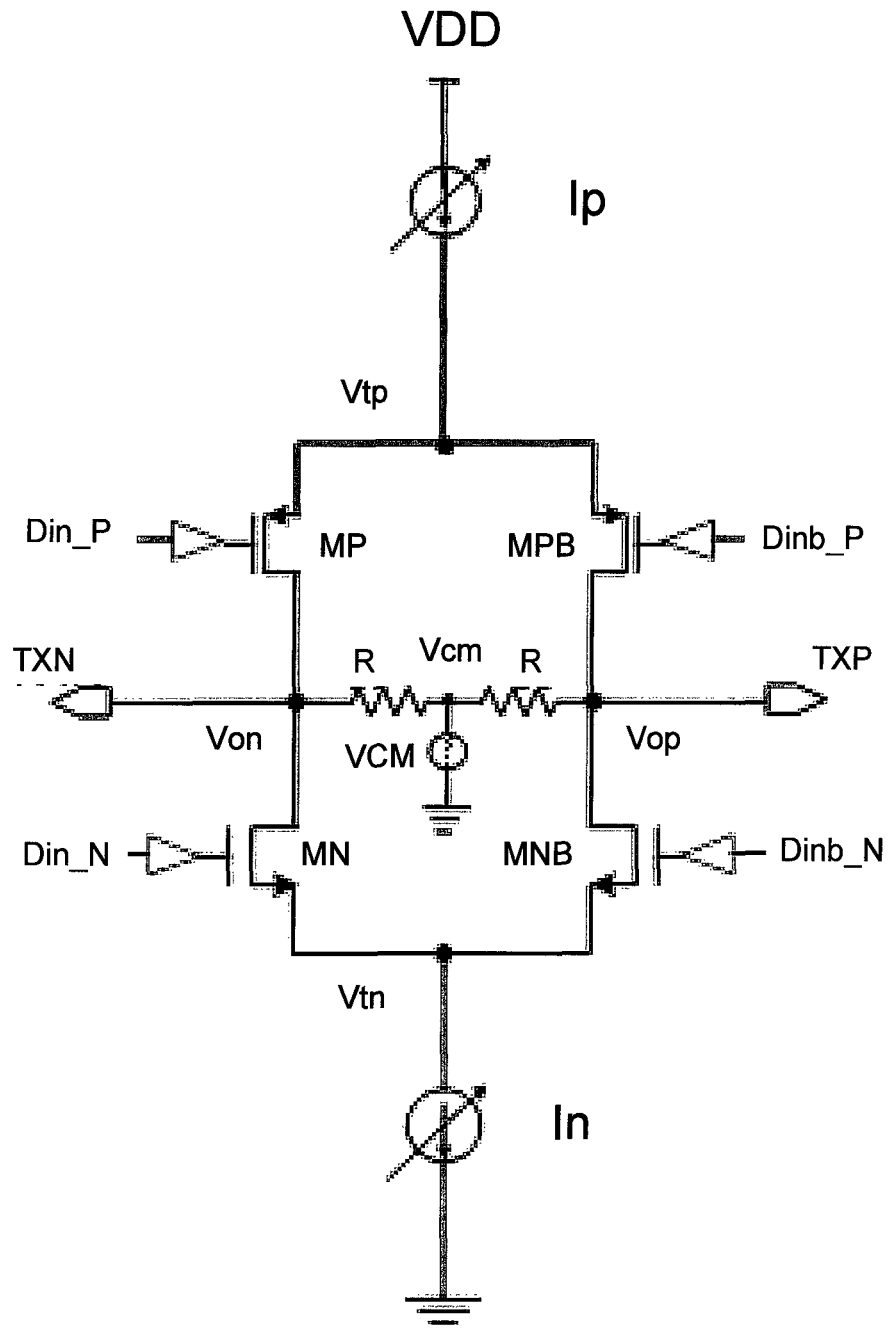
FIG. 2          200

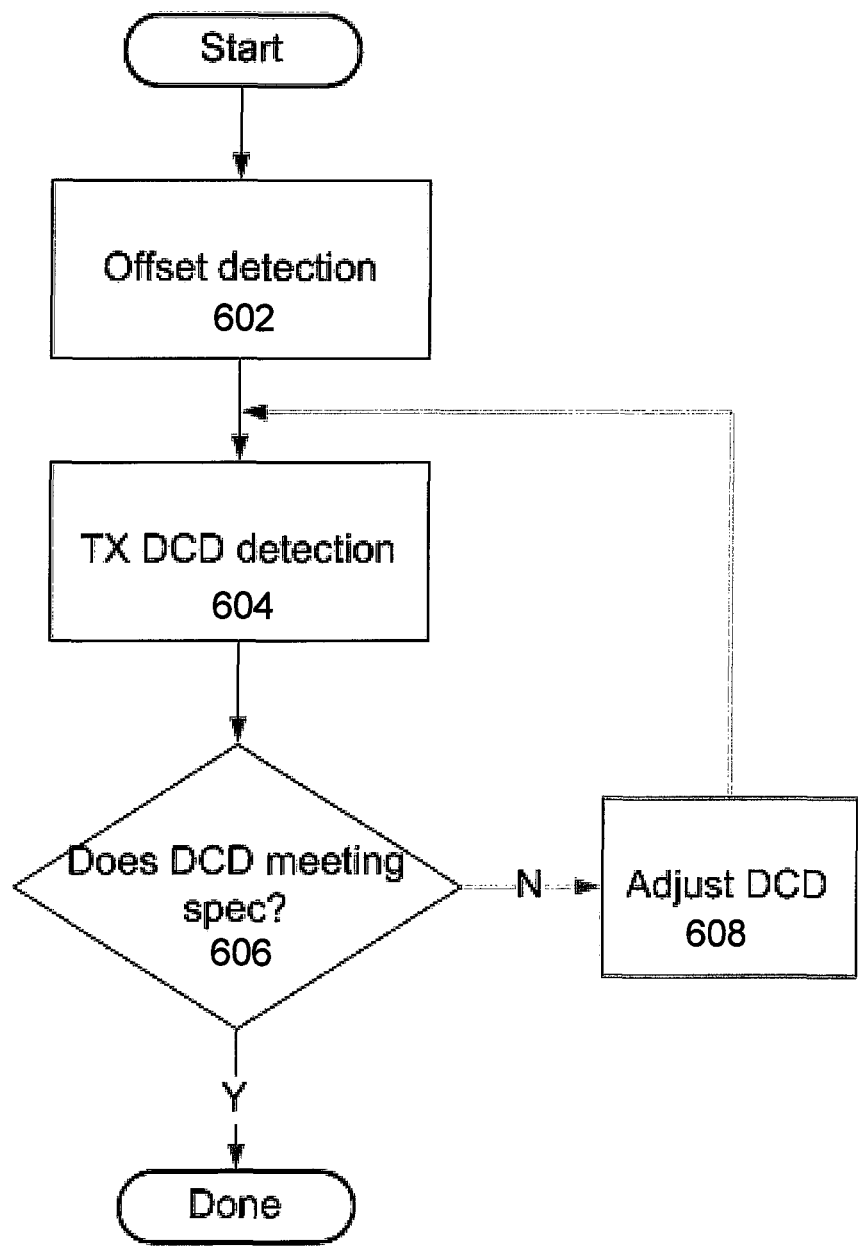
FIG. 6       600

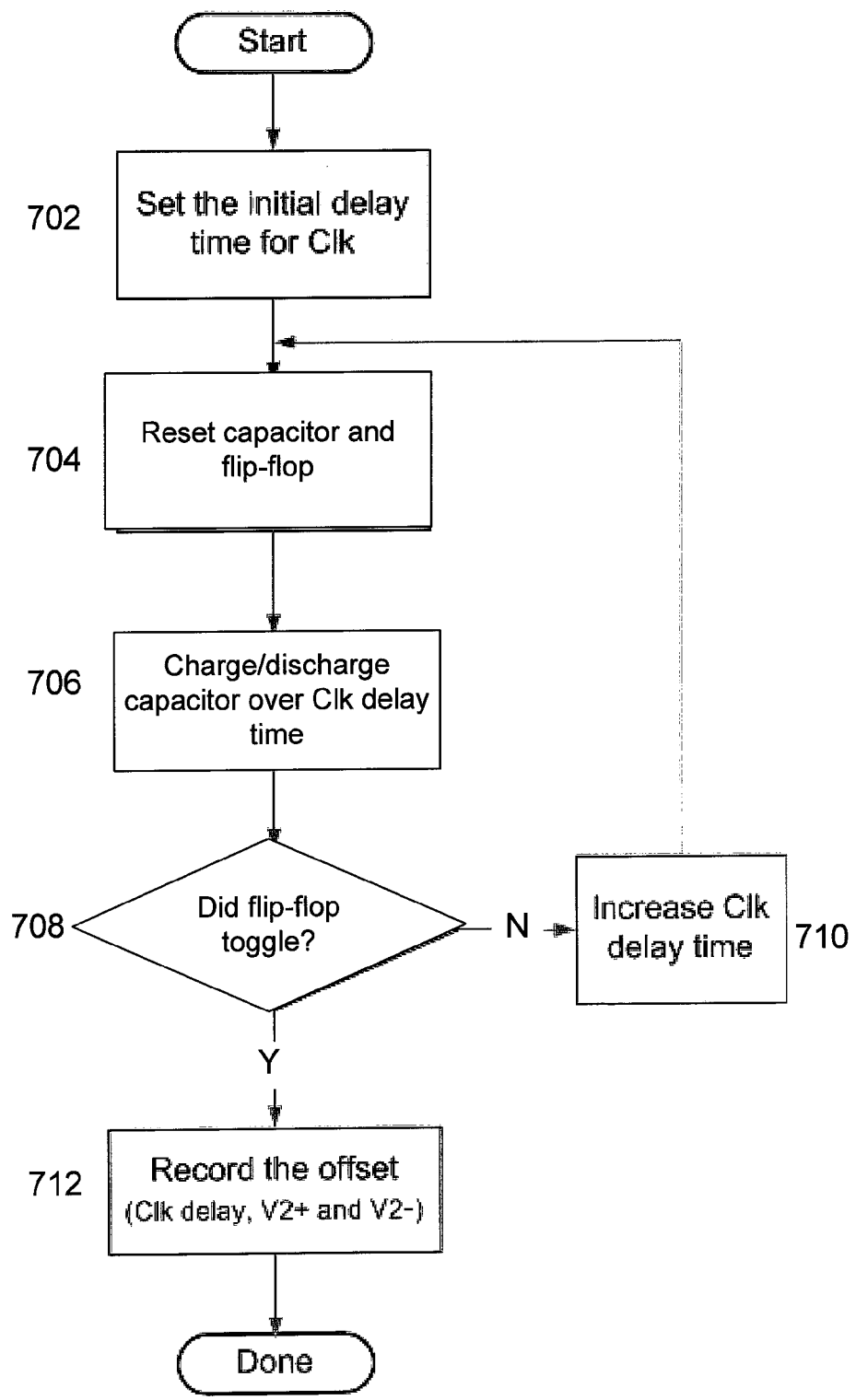
FIG. 7    602

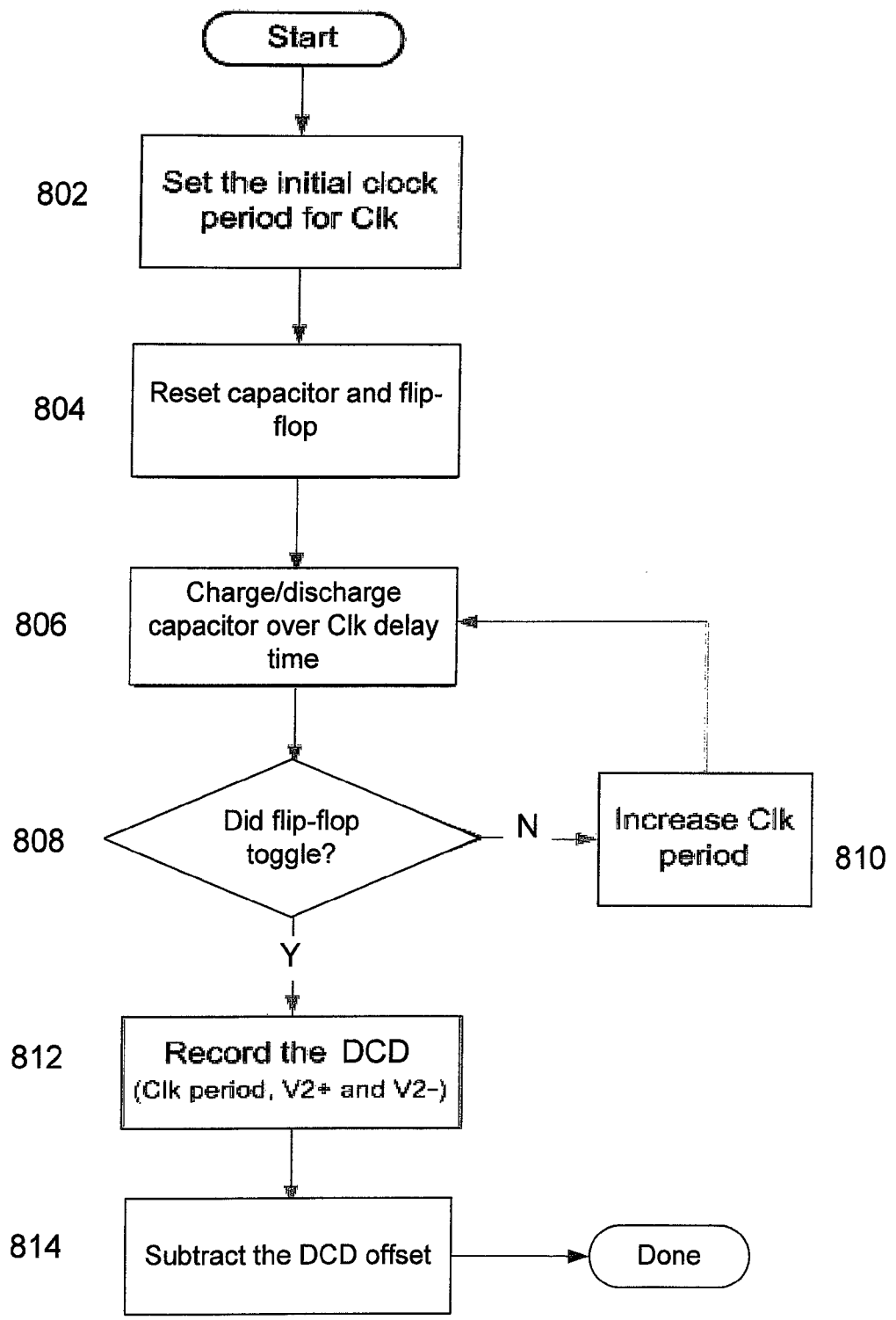
FIG. 8      604

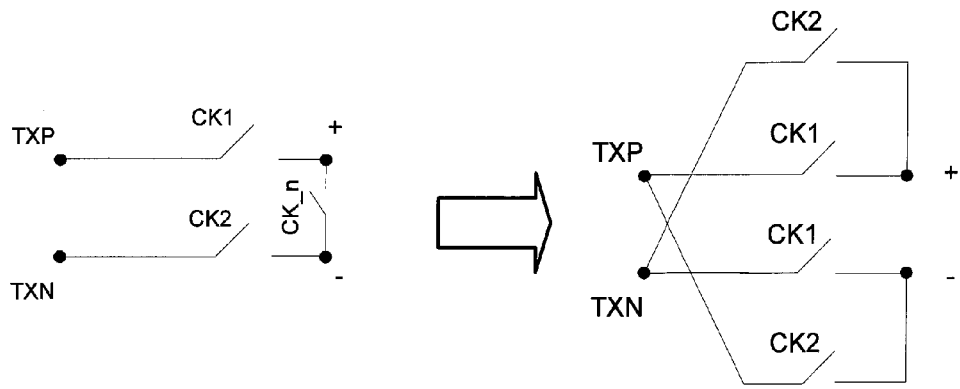
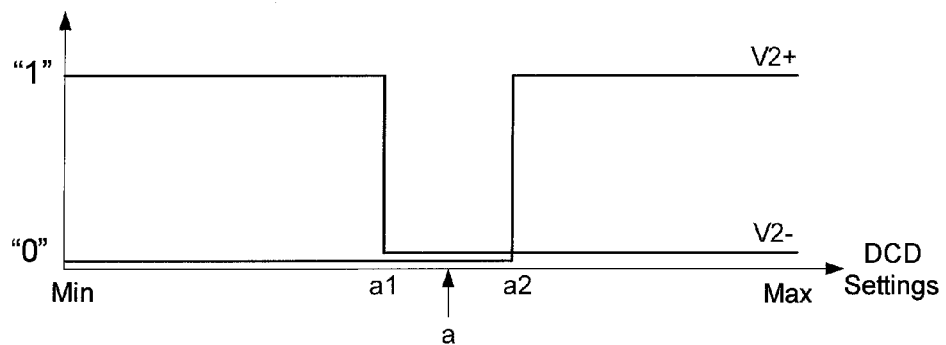
Step #1
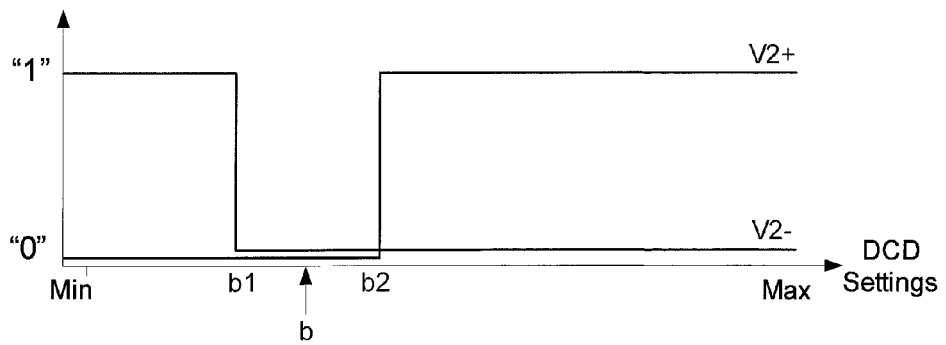
Step #2
FIG. 9A

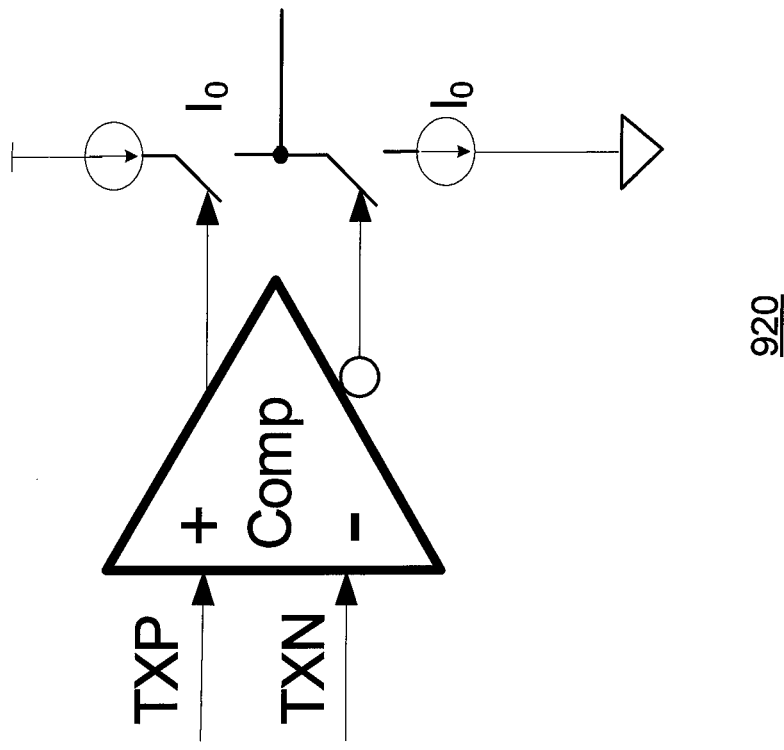
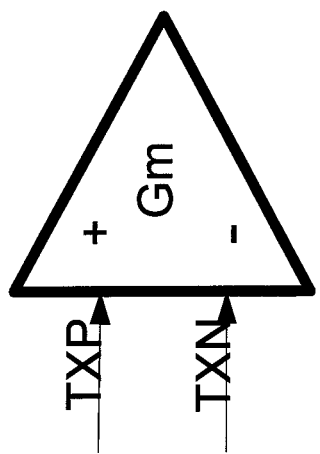
FIG. 9B

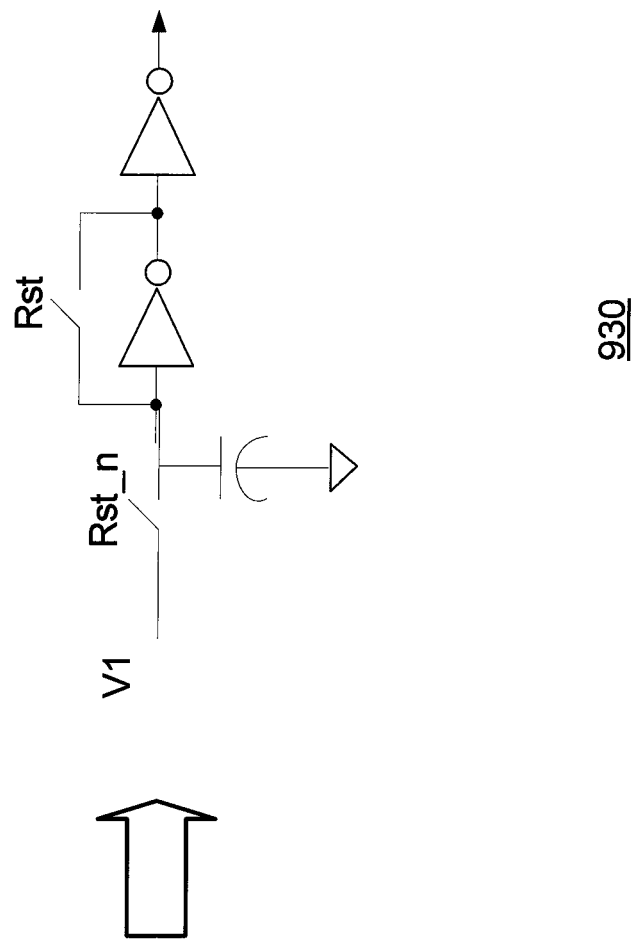
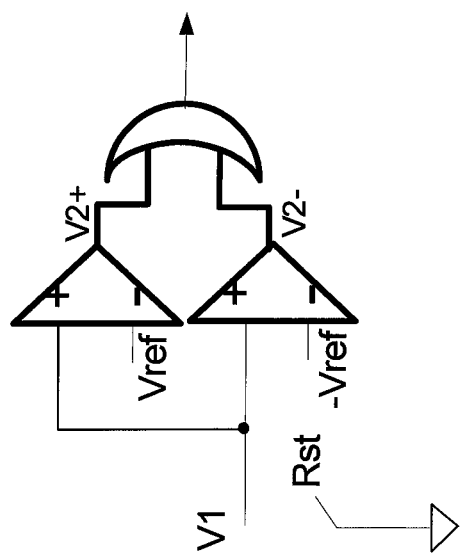
FIG. 9C

1000

FIG. 11  Step #1

FIG. 12  Step #2

APPARATUS AND METHODS FOR DETECTION AND CORRECTION OF TRANSMITTER DUTY CYCLE DISTORTION

BACKGROUND

1. Technical Field

The present invention relates generally to serial interfaces for integrated circuits.

2. Description of the Background Art

Serial interfaces are used to communicate data between devices in a system. Serial interface protocols have been developed at increasingly fast data rates. Examples of industry-standard protocols for serial interfaces include PCI Express® (Peripheral Component Interconnect Express), XAUI (X Attachment Unit Interface), sRIO (serial Rapid IO), and many others.

As the data rates of serial interfaces have increased beyond one gigabit-per-second, jitter has become a significant performance limitation. Jitter relates to the deviation in time of signal transitions from their ideal transition points.

SUMMARY

One embodiment relates to an integrated circuit which includes a transmitter buffer circuit, a duty cycle distortion (DCD) detector, correction logic, and a duty cycle adjuster. The DCD detector is configured to selectively couple to the serial output of the transmitter buffer circuit. The correction logic is configured to generate control signals based on the output of the DCD detector. The duty cycle adjuster is configured to adjust a duty cycle of the serial input signal based on the control signals.

Another embodiment relates to a method of correcting duty cycle distortion in a transmitter. A serial input data signal is buffered by a buffer circuit to generate a serial output data signal. The duty cycle distortion in the serial output data signal is detected by a duty cycle distortion detector circuit. Control signals are generated based on the detected duty cycle distortion, and a duty cycle of the serial input data signal is adjusted based on the control signals.

Other embodiments and features are also disclosed.

BRIEF DESCRIPTION OF THE DRAWINGS

FIG. 2 shows a transmitter buffer circuit in accordance with an embodiment of the invention.

FIG. 6 is a flow chart of a method for detection and correction of transmitter duty cycle detection in accordance to an embodiment of the invention.

FIG. 7 is a flow chart of a procedure to detect a DCD offset in accordance to an embodiment of the invention.

FIG. 8 is a flow chart of a procedure to detect duty cycle distortion in accordance to an embodiment of the invention.

FIG. 9A depicts a switch circuit which may be used instead of the switch circuit in FIG. 3 in accordance with an embodiment of the invention.

FIG. 9B depicts a comparator and charge pump circuit which may be used instead of the transconductance amplifier Gm in FIG. 3 in accordance with an embodiment of the invention.

FIG. 9C depicts an inverter circuit which may be used instead of the comparator circuit in FIG. 3 in accordance with an embodiment of the invention.

DETAILED DESCRIPTION

Sources of jitter may be categorized as either random or deterministic. One type of deterministic jitter of particular interest to the present application is jitter caused by duty cycle distortion (DCD).

Commonly-owned U.S. patent application Ser. No. 13/083,431, filed Apr. 8, 2011, discloses techniques for reducing DCD in periodic signals. In particular, it discloses a solution to correct transmission clock path DCD using calibration. As relevant to the present application, applicant has further determined that sources of transmitter DCD include, not only the transmission clock path, but also the data path and the transmission buffer. Each of these DCD sources contribute to the net DCD in the transmitter output.

The present disclosure provides a solution which effectively deals with all transmitter DCD sources at once. The solution utilizes a new DCD correction system. The DCD correction system detects and corrects the net DCD in the transmitter output and may be advantageously implemented with on-die circuitry. The DCD correction system includes three components: a self-calibration (offset detection) component, a DCD detection component, and a DCD adjustment component.

Figure 1A:
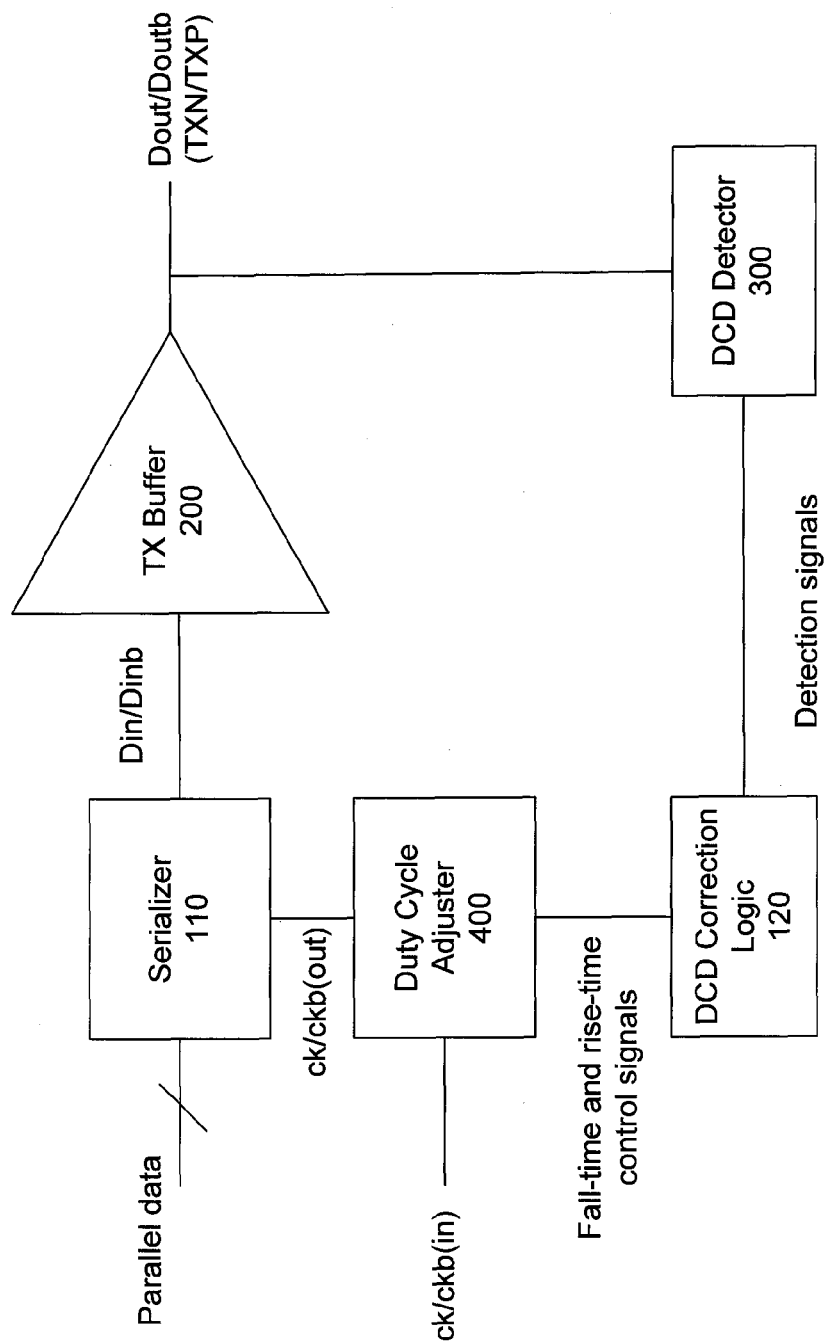
FIG. 1A depicts a circuit apparatus for the detection and correction of transmitter duty cycle distortion in accordance with an embodiment of the invention.

FIG. 1A depicts a circuit apparatus 100 for the detection and correction of transmitter duty cycle distortion in accordance with an embodiment of the invention. The circuit apparatus 100 includes a serializer 110, a transmitter buffer circuit 200, DCD detection circuitry 300, DCD correction logic 120, and duty cycle adjuster circuit 400.

The serializer 110 is arranged to receives parallel data signals and use the clock signals (ck/ckb) to serialize the parallel data. In one implementation, the serializer 110 may have, as its last stage, a 2:1 multiplexer which is triggered by both rising and falling edges (i.e. the driver may have a half-rate structure). As shown, a single differential data signal (Din/Dinb) may be output by the serializer 110 to the transmitter buffer circuit 200.

The transmitter buffer circuit 200 buffers the differential data signal (Din/Dinb) from the serializer 110. The transmitter buffer circuit 200 generates a differential data signal (Dout/Doutb) on differential outputs (TXN/TXP). One embodiment of the transmitter buffer circuit 200 is described below in relation to FIG. 2.

The DCD detection circuitry 300 is arranged to selectively tap into the output differential data signal (Dout/Doutb). During a normal operation mode of the transmitter, the DCD detection circuitry 300 may advantageously minimize loading the differential outputs (TXN/TXP). During a DCD detection mode, the DCD detection circuitry 300 may generate one or more detection signals which depend on the DCD of the differential data signal (Dout/Doutb). One embodiment of the DCD detection circuitry 300 is described below in relation to FIG. 3. In that embodiment, the detection signals include a clock delay signal (Clk delay) and voltage signals V2+ and V2−.

The DCD correction logic 120 receives the detection signals from the DCD detection circuitry 300. The DCD correction logic 120 may include a state machine which is configured to generate fall-time and rise-time control signals based on the detection signals. These control signals may be output to the duty cycle adjuster circuit 400.

The duty cycle adjuster circuit 400 is arranged to adjust the duty cycle of the transmitter output based on the control signals from the DCD detection circuitry 300. One embodiment of the duty cycle adjuster circuit 400 is described below in relation to FIG. 4. In this circuit apparatus 100, the duty cycle adjuster circuit 400 makes adjustments to the duty cycle of the differential clock signals [ck/ckb(in)]. The duty cycle adjuster circuit 400 provides the adjusted differential clock signals [ck/ckb(out)] to the serializer 110.

Figure 1B:
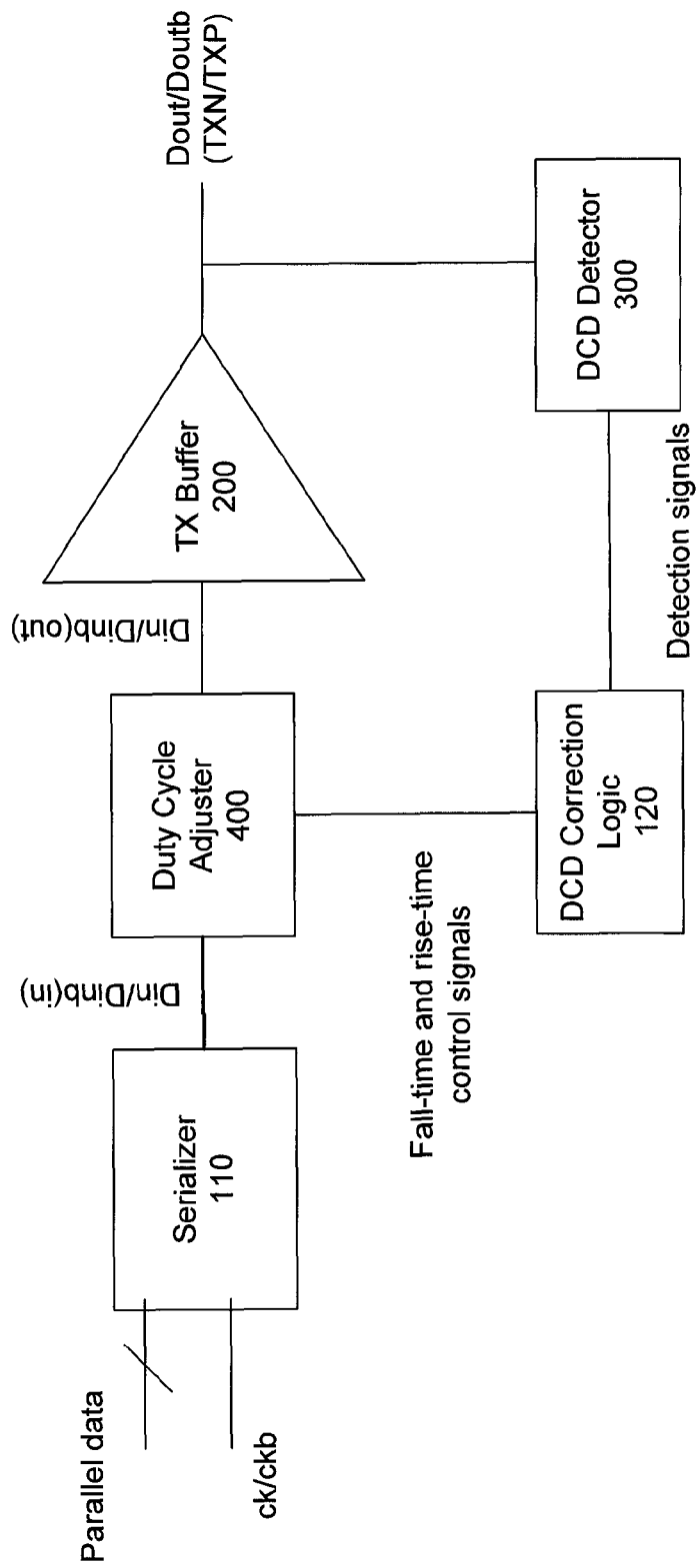
FIG. 1B depicts a circuit apparatus for the detection and correction of transmitter duty cycle distortion in accordance with another embodiment of the invention.

FIG. 1B depicts a circuit apparatus 150 for the detection and correction of transmitter duty cycle distortion in accordance with another embodiment of the invention. In contrast to the circuit apparatus 100 in FIG. 1A which adjusts the duty cycle of the differential clock signals (ck/ckb), the circuit apparatus 150 in FIG. 1B adjusts the duty cycle of the differential data signal (Din/Dinb).

In this circuit apparatus 150, the duty cycle adjuster circuit 400 makes adjustments to the duty cycle of the differential data signals [Din/Dinb(in)] received from the serializer 110. The duty cycle adjuster circuit 400 provides the adjusted differential clock signals [Din/Dinb(out)] to the TX buffer 200.

FIG. 2 shows a transmitter (TX) buffer circuit 200 in accordance with an embodiment of the invention. The TX buffer circuit 200 is based on an H-tree buffer structure. The H-tree buffer structure includes four switches (MP, MN, MPB, and MNB) and pull-up and pull-down current drivers (Ip and In).

The pull-up current driver (Ip) may be connected in series between power supply voltage source (VDD) and the node Vtp, while the pull-down current driver (In) may be connected in series between ground and the node Vtn.

On the left side of the H-tree, PMOS transistor MP and NMOS transistor MN are connected in series between nodes Vtp and Vtn. In particular, node Vtp is connected to the source of MP, the drain of MP is connected to the source of MN at node Von, and the drain of MN is connected to the node Vtn. On the right side of the H-tree, PMOS transistor MPB and NMOS transistor M1B are also connected in series between nodes Vtp and Vtn. In particular, node Vtp is connected to the source of MPB, the drain of MPB is connected to the source of MNB at node Vop, and the drain of MN1B is connected to the node Vtn.

Nodes Vop and Von are connected to differential outputs TXP and TXN, respectively, such that the final output signal is the differential signal (Vop−Von). Two resistor R are connected in series between nodes Vop and Von.

Common mode voltage node Vcm is located between the two resistors R and may be driven by a common mode driver connected between VCM and ground.

As shown in FIG. 2, four single-ended clocked data signals (Din_P, Din_N, Dinb_P, and Dinb_N) may be used to control the four switches (MP, MN, MPB, and MNB, respectively). This is due, in part, to the fact that the PMOS switches (MP and MPB) generally require different signals from the NMOS switches (MN and MNB) because of voltage level switching.

Applicant has determined that the total transmitter duty cycle distortion (TX DCD) includes contributions from TX buffer DCD, clock path DCD and data path DCD. The TX buffer DCD may be due to device mismatches between PMOS and NMOS switches and/or device mismatches among PMOS or NMOS switches. The TX buffer DCD shows up as a data-dependent jitter in the TX output. The clock path DCD may be caused by the four clock paths having different delays. As such, variations in supply voltage and/or temperature may increase or decrease differences between rise and fall times.

There is no DCD cancellation or correction for the TX buffer in conventional transceiver products. Such correction of TX buffer DCD is problematic for the following reasons. First, there is no mechanism to detect the TX buffer DCD. Second, any load added to the TX output pins will adversely impact the TX return loss. While an external loopback can detect TX buffer DCD, such an external solution is inefficient and generally requires external test equipment which includes eye viewer support.

The present disclosure provides an innovative solution to the above-described problems. The DCD correction system disclosed herein includes a self-calibration process and may be advantageously implemented with on-die circuitry. The DCD correction system detects and corrects the net DCD (i.e. the total DCD) in the transmitter output.

Figure 3:
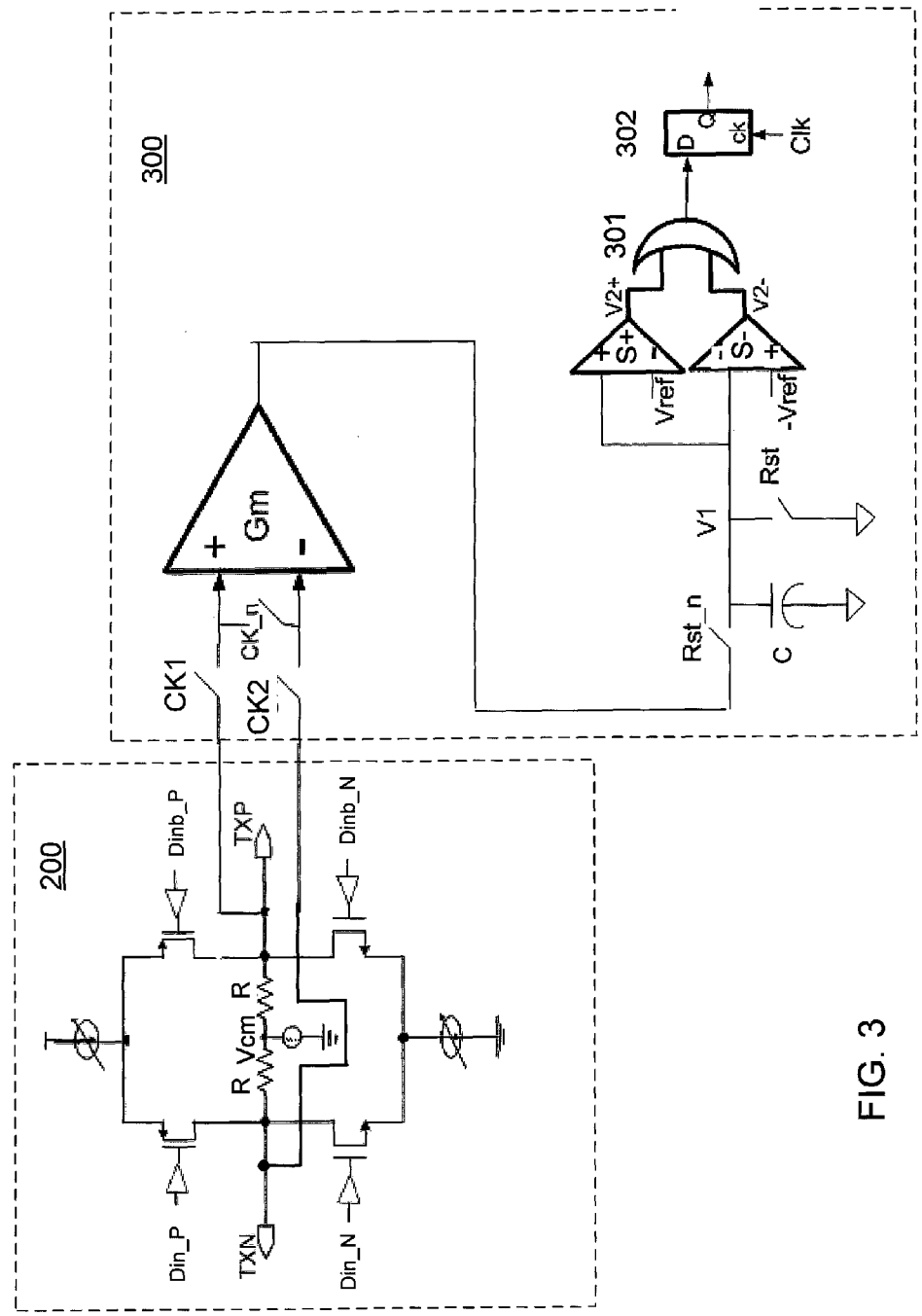
FIG. 3 shows circuitry configured to detect duty cycle distortion in accordance with an embodiment of the invention.

FIG. 3 depicts circuitry arranged to detect duty cycle distortion in accordance with an embodiment of the invention. On the left side of FIG. 3 is shown the TX buffer circuit 200 described above in relation to FIG. 2. As shown, DCD detection circuitry 300 may be coupled to the differential outputs (TXP/TXN) of the TX buffer circuit 200. In this embodiment, the DCD detection circuitry 300 effectively converts the DCD of the differential data signal (Dout/Doutb) to an electrical current which charges or discharges a capacitor.

As shown in FIG. 3, the DCD detection circuitry 300 may include a transconductance amplifier (transconductor Gm) and three switches (CK1, CK2, and CK_n). These switches may be advantageously configured as shown in FIG. 3 to selectively isolate the DCD detection circuitry 300 from the TX buffer circuit 200 and to selectively enable offset calibration.

A first switch (CK1) is coupled between the output TXP of the TX buffer circuit 200 and the positive input terminal (+) of the transconductor Gm. A second switch (CK2) is coupled between the output TXN of the TX buffer circuit 200 and the negative input terminal (−) of the transconductor Gm. A third switch (CK_n) is coupled between the positive and negative input terminals of the transconductor Gm.

As further shown in FIG. 3, the DCD detection circuitry 300 may also include a fourth switch (Rst_n) configured between the output of the transconductor Gm and a voltage node V1. A capacitor C and a fifth switch (Rst) are configured in parallel between the node V1 and ground. The node V1 is also coupled to the positive input terminals of two comparators (S+ and S−).

The comparators (S+ and S−) effectively compare the voltage V1 (i.e. the voltage on node V1) and compare them against reference voltages +Vref and −Vref, respectively, so as to generate comparator output voltages V2+ and V2−, respectively. The positive comparator S+ outputs a logical one (a high logic state) if V1 is greater than +Vref and otherwise outputs a logical zero (a low logic state). The negative comparator S− outputs a logical one (a high logic state) if V1 is less than −Vref and otherwise outputs a logical zero (a low logic state).

Toggle circuit 301 receives the comparator output voltages V2+ and V2− and generates an output which is provided to the data input of a flip-flop circuit 302. The output of the toggle circuit 301 may be in a first state (for example, a low logic state) if the outputs of both comparators S+ and S− are in a low logic state. The output of the toggle circuit 301 may be in a second state (for example, a high logic state) if the output of either S+ or S− (or both) is in a high logic state. In other words, the toggle circuit 301 may be configured to be toggled (for example, from a low state to a high state) if the voltage V1 is outside the range {−Vref, +Vref}.

For normal operation of the transmitter, the first and second switches (CK1 and CK2) may be turned off (i.e. open). The open switches isolate the transconductor Gm from the TX buffer circuit 200. This minimizes loading on the outputs TXP and TXN during the normal operation.

During DCD offset calibration, the first and second switches (CK1 and CK2) are turned off (i.e. opened), and the third switch (CK_n) is turned on (i.e. closed). In addition, the fourth switch (Rst_n) is turned on (i.e. closed) and the fifth switch (Rst) is turned off (i.e. opened). This allows the offset current from the transconductor Gm to charge or discharge the capacitor C. An embodiment of the offset calibration process is described in further detail below in relation to the flow chart of FIG. 7.

During DCD detection, the first and second switches (CK1 and CK2) are turned on (i.e. closed), and the third switch (CK_n) is turned off (i.e. opened). In addition, the fourth switch (Rst_n) is turned on (i.e. closed) and the fifth switch (Rst) is turned off (i.e. opened). This allows the differential voltage signal (TXP, TXN) to be converted by the transconductor Gm to current which charges or discharges the capacitor C. An embodiment of the DCD detection process is described in further detail below in relation to the flow chart of FIG. 8.

Figure 4:
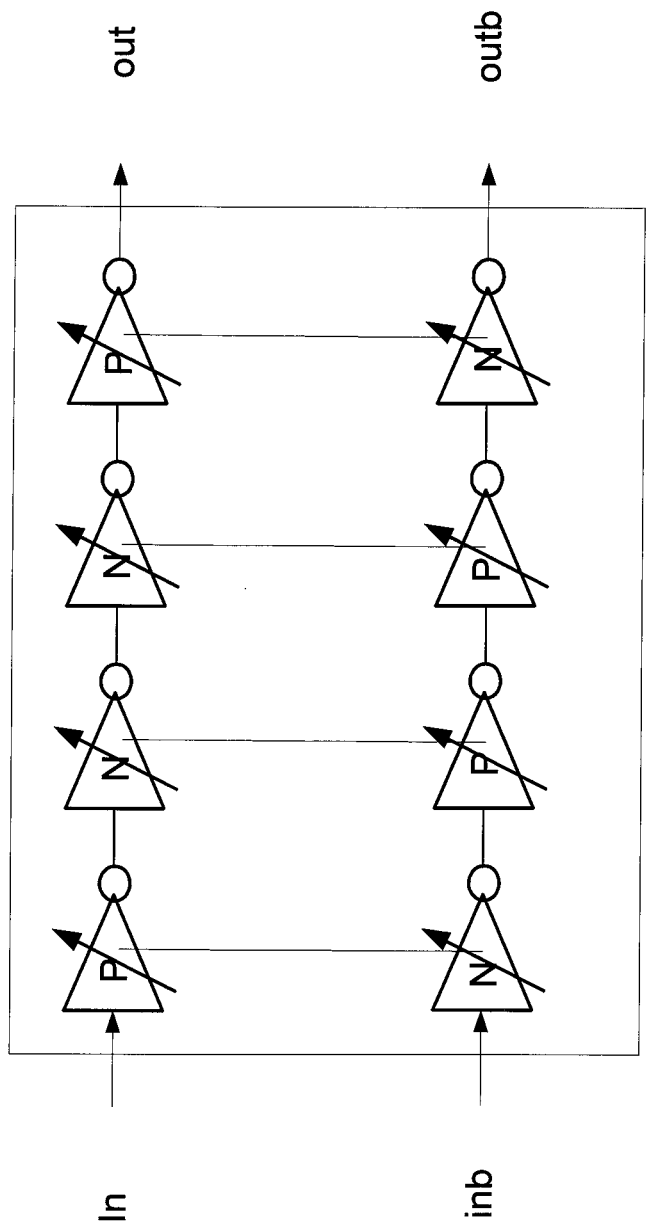
FIG. 4 depicts duty cycle adjustment circuitry in accordance with an embodiment of the invention.

FIG. 4 depicts duty cycle adjustment circuitry 400 in accordance with an embodiment of the invention. The duty cycle adjustment circuitry 400 is configured to generate an output differential signal (out/outb) by adjusting the rise and/or fall times for an input differential signal (in/inb). This embodiment 400 may be utilized in the circuit apparatus 100 of FIG. 1A or the circuit apparatus 150 of FIG. 1B.

As shown in FIG. 4, the duty cycle adjustment circuit for each individual signal includes a series of programmable inverters. In particular, the duty cycle adjustment circuit for each individual signal may comprise alternating programmable PMOS (p-channel metal oxide semiconductor) inverters and programmable NMOS (n-channel metal oxide semiconductor) inverters.

The programmable NMOS inverters may be programmed to adjust the fall time of the signal, and the programmable PMOS inverters may be programmed to adjust the rise time of the signal. Each two inverters in a same column in FIG. 4 are of opposite polarity (one NMOS and the other PMOS), and those two inverters in the same column may be configured such that they are adjusted at a same time. This is indicated by the lines connecting inverters in the same column in FIG. 4.

While two programmable PMOS inverters and two programmable NMOS inverters are shown in the duty cycle adjustment circuit for each individual signal in FIG. 4, other embodiments may include additional pairs of programmable inverters to provide for shorter rise and/or fall times. In other words, while four inverter stages (two PMOS and two NMOS) are shown or each signal in FIG. 4, other numbers of inverter stages may be used.

Figure 5A:
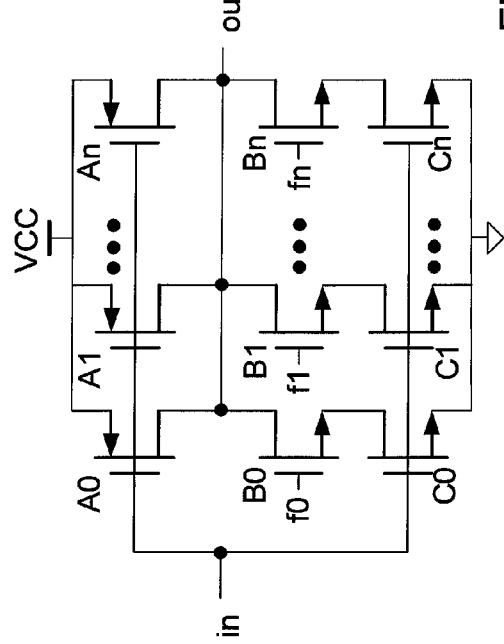
FIGS. 5A and 5B show example implementations of a programmable NMOS inverter and a programmable PMOS inverter, respectively.
Figure 5B:
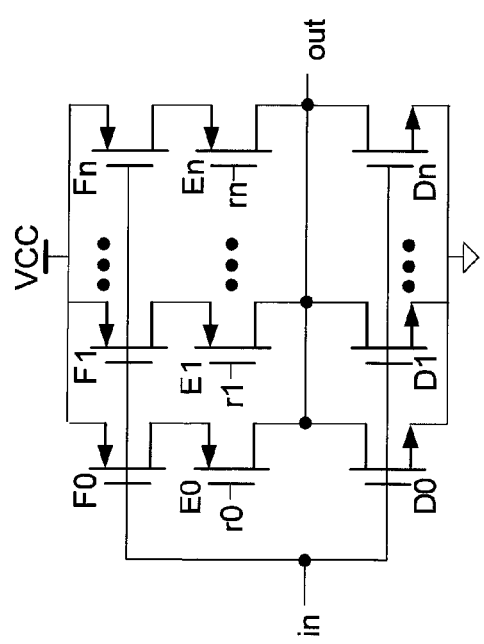

FIGS. 5A and 5B show example implementations of a programmable (adjustable) NMOS inverter and a programmable (adjustable) PMOS inverter, respectively. The programmable NMOS and PMOS inverters in FIGS. 5A and 5B may be utilized in the duty cycle adjustment circuit of FIG. 4.

FIG. 5A shows a programmable NMOS inverter that includes a set of PMOS FETs (field effect transistors) (A0 through An) and two sets of NMOS FETs ("middle set" B0 through Bn and "bottom set" C0 through Cn). Each set includes n+1 transistors, where n is any number. For example, n may be equal to seven such that each set has eight transistors.

The set of PMOS FETs (A0 through An) are arranged in parallel between a supply voltage VCC and an output node (out), where their sources are coupled to the supply voltage and their drains of the are coupled to the output node. The sources of the middle set of NMOS FETs (B0 through Bn) are also coupled to the output node (out). The drains of the middle set of NMOS FETs (B0 through Bn) are coupled to the sources of the bottom set of NMOS FETs (C0 through Cn, respectively). The drains of the bottom set of NMOS FETs (C0 through Cn) are connected to ground.

The gate of each of the PMOS FETs (A0 through An) and of each of the bottom set of NMOS FETs (C0 through Cn) are coupled to the input node (in). Meanwhile, a set of n+1 digital fall-time control signals (f0 through fn) are provided to the gates of the middle set of NMOS FETs (B0 through Bn, respectively).

In accordance with an embodiment of the invention, the fall-time control signals (f0 through fn) may be generated by a DCD correction logic circuit. The DCD correction logic circuit may be configured to change the logic states of the fall-time control signals (f0 through fn) in order to adjust the durations of the logical high-to-low transitions in the signal generated at the output (out). In particular, the DCD correction logic circuit may cause one or more of the fall-time control signals (f0 through fn) to transition from high-to-low to turn off corresponding transistors in the middle set of NMOS FETs (B0 through Bn).

Turning off more of the transistors in the middle set of NMOS FETs (B0 through Bn) reduces the total pull-down current that pulls the voltage at the output node (out) from VCC to ground in response to a logical low-to-high transition in the signal at the input (in). Hence, increasing the number of fall-time control signals (f0 through fn) which are in logic low states increases the duration of a high-to-low transition in the signal generated at the output (out). Alternatively, increasing the number of fall-time control signals (f0 through fn) which are in logic high states decreases the duration of a high-to-low transition in the signal generated at the output (out).

FIG. 5B shows a programmable PMOS inverter that includes a set of NMOS FETs (field effect transistors) (D0 through Dn) and two sets of PMOS FETs ("middle set" E0 through En and "top set" F0 through Fn). Each set includes n+1 transistors, where n is any number. For example, n may be equal to seven such that each set has eight transistors.

The set of NMOS FETs (D0 through Dn) are arranged in parallel between an output node (out) and ground, where their drains are coupled to the ground, and their sources are coupled to the output node. The drains of the middle set of PMOS FETs (E0 through En) are also coupled to the output node (out). The sources of the middle set of PMOS FETs (E0 through En) are coupled to the drains of the second set of PMOS FETs (F0 through Fn). The drains of the top set of PMOS FETs (F0 through Fn) are connected to a supply voltage VCC.

The gate of each of the NMOS FETs (D0 through Dn) and of each of the top set of PMOS FETs (F0 through Fn) are coupled to the input node (in). Meanwhile, a set of n+1 digital rise-time control signals (r0 through rn) are provided to the gates of the middle set of PMOS FETs (E0 through En, respectively).

In accordance with an embodiment of the invention, the rise-time control signals (r0 through rn) may be generated by a DCD correction logic circuit. The DCD correction logic circuit may be configured to change the logic states of the rise-time control signals (r0 through rn) in order to adjust the durations of the logical low-to-high transitions in the signal generated at the output (out). In particular, the DCD correction logic circuit may cause one or more of the rise-time control signals (r0 through rn) to transition from low-to-high to turn off corresponding transistors in the middle set of PMOS FETs (E0 through En).

Turning off more of the transistors in the middle set of PMOS FETs (E0 through En) reduces the total pull-up current that pulls the voltage at the output node (out) from ground to VCC in response to a logical high-to-low transition in the signal at the input (in). Hence, increasing the number of rise-time control signals (r0 through rn) which are in logic high states increases the duration of a low-to-high transition in the signal generated at the output (out). Alternatively, increasing the number of rise-time control signals (r0 through rn) which are in logic low states decreases the duration of a low-to-high transition in the signal generated at the output (out).

FIG. 6 is a flow chart of a method 600 for detection and correction of transmitter duty cycle detection in accordance to an embodiment of the invention. The method 600 includes an offset detection process 602, a transmitter DCD detection process 604, and DCD adjustment 608. In one embodiment, the method 600 may be implemented using the circuit apparatus 100 of FIG. 1A. In another embodiment, the method 600 may be implemented using the circuit apparatus 150 of FIG. 1B.

As shown, the method 600 may begin with an offset detection process 602. A DCD offset due to the DCD detection circuitry 300 is determined and recorded during the offset detection process 602. The offset detection process 602 may be implemented as a self-calibration procedure using on-chip circuitry. An embodiment of the offset detection process 602 using the circuitry 300 of FIG. 3 is described below in relation to FIG. 7.

After the offset detection 602, the method 600 may perform the transmitter (TX) DCD detection process 604. Duty cycle distortion (DCD) from the transmitter is detected and recorded during this process 604. The TX DCD detection process 604 may be implemented using on-chip circuitry. An embodiment of the TX DCD detection process 604 using the circuitry 300 of FIG. 3 is described below in relation to FIG. 8.

A determination 606 may then be made as to whether or not the detected DCD is within a specified range (i.e. meets the required specification). If the detected DCD is within the specified range, then no adjustment is needed and the method 600 may be done.

Otherwise, if the detected DCD is outside the specified range, then the method 600 may perform a DCD adjustment 608 to reduce the DCD. Thereafter, the method 600 may loop back and perform the TX DCD detection process 604 again.

In accordance with an embodiment of the invention, the DCD adjustment 608 may be implemented using a duty cycle adjustment circuit. In one embodiment, the duty cycle adjustment circuit 400 of FIG. 4A may be utilized in the circuit apparatus 100 of FIG. 1A. In another embodiment, the duty cycle adjustment circuit 450 of FIG. 4B may be utilized in the circuit apparatus 150 of FIG. 1B.

FIG. 7 is a flow chart of a procedure 602 to detect a DCD offset in accordance to an embodiment of the invention. This procedure 602 may be performed, for example, using the DCD detection circuitry 300 shown in FIG. 3 or alternate circuitry described herein.

Per the first step 702, an initial delay time may be set for the Clk signal which is to trigger the flip-flop (sample-and-hold) circuit 302 in the DCD detection circuitry. As an illustrative example, the initial delay time may be set to 1,000 clock cycles of the data signal.

Per the second step 704, the capacitor C and the flip-flop 302 may be reset. Resetting the capacitor C may be performed by closing the Rst switch (while having the Rst_n switch open). The flip-flop 302 may be reset to a clear (zero) state.

Per the third step 706, the capacitor is allowed to be charged or discharged by an offset current which is output the transconductor Gm over the Clk delay time. This step 706 may be performed by keeping switches CK1, CK2, and Rst open while having switches CK_n and Rst_n be closed.

At the end of the Clk delay time, the voltage V1 is sampled if V1 is outside the range {−Vref, +Vref}. In particular, after the Clk delay time is swept, the output (Out) of the flip-flop 302 is checked to determine 708 whether or not the flip-flop 302 has toggled (i.e. changed state to one).

If the flip-flop 302 has not toggled, then this indicates that the voltage V1 (due to charging or discharging of the capacitor) is within the voltage range {−Vref, +Vref}. In this case, the Clk delay time is increased 710 (for example, by a predetermined fraction or multiplier) and the method 602 loops back to perform the second step 704.

On the other hand, if the flip-flop 302 has toggled, then this indicates that the voltage V1 (due to charging or discharging of the capacitor) is outside the voltage range {−Vref, +Vref}. In this case, data indicating the DCD offset may be recorded 712. In particular, the Clk delay time and the logic states of voltages V2+ and V2− may be recorded 712.

If V2+ is in a high logic state, then the DCD offset voltage (Voffset+) may be obtained by multiplying +Vref by the capacitance C and dividing the result by the transconductor gain Gm multiplied by the delay time (Tdelay). In equation form, Voffset+=(+Vref*C)/(Gm*Tdelay).

On the other hand, if V2− is in a high logic state, then the DCD offset voltage (Voffset−) may be obtained by multiplying −Vref by the capacitance C and dividing the result by the transconductor gain Gm multiplied by the delay time (Tdelay). In equation form, Voffset−=(−Vref*C)/(Gm*Tdelay).

FIG. 8 is a flow chart of a procedure 604 to detect duty cycle distortion in accordance to an embodiment of the invention. This procedure 604 may be performed, for example, using the DCD detection circuitry 300 shown in FIG. 3 or alternate circuitry described herein.

Per the first step 802, an initial clock period may be set for the Clk signal which is to trigger the flip-flop 302 in the DCD detection circuitry. As an illustrative example, the initial clock period for Clk may be set to 1,000 clock cycles of the data signal.

Per the second step 804, the capacitor C and the flip-flop 302 may be reset. Resetting the capacitor C may be performed by closing the Rst switch (while having the Rst_n switch open). The flip-flop 302 may be reset to a clear (zero) state.

Per the third step 806, the capacitor is allowed to be charged or discharged by the output current of the transconductor Gm over the time period indicated by Clk (the Clk period). This step 706 may be performed by keeping switches CK1, CK2, and Rst open while having switches CK_n and Rst_n be closed.

At the end of the Clk period, the voltage V1 is sampled if V1 is outside the range {−Vref, +Vref}. In particular, after the Clk period is swept, the output (Out) of the flip-flop 302 is checked to determine 808 whether or not the flip-flop 302 has toggled (i.e. changed state to one).

If the flip-flop 302 has not toggled, then this indicates that the voltage V1 (due to charging or discharging of the capacitor) is within the voltage range {−Vref, +Vref}. In this case, the Clk period is increased 810 (for example, by a predetermined fraction or multiplier) and the method 604 loops back to perform the second step 804.

On the other hand, if the flip-flop 302 has toggled, then this indicates that the voltage V1 (due to charging or discharging of the capacitor) is outside the voltage range {−Vref, +Vref}. In this case, data indicating the measured DCD may be recorded. In particular, the Clk period and the voltages V2+ and V2− may be recorded. If V2+ is greater than +Vref, then the measured DCD would be V2+ divided by the Clk period. On the other hand, if V2− is less than −Vref, then the measured DCD would be V2− divided by the Clk period.

Subsequently, per step 814, the DCD offset is subtracted from the measured DCD to determine the detected DCD. This detected DCD may be compared against a specified range, per step 606 in FIG. 6, to determine whether or not DCD adjustment 608 is needed.

FIG. 9A depicts a switch circuit 910 which may be used instead of the switch circuit in FIG. 3 in accordance with an embodiment of the invention. As seen, this switch circuit 910 includes two switches labeled CK1 and two switches labeled CK2. This switch circuit 910 may be substituted for the switch circuit (with CK1, CK2 and CK_n) in between the TX buffer circuit 200 and the transconductor Gm in FIG. 3.

A first CK1 switch may connect the differential TXP signal from the TX buffer circuit 200 to the positive (+) output node (which may be connected to the positive input terminal of the transconductor Gm, for example), and a second CK1 switch may connect the differential TXN signal from the TX buffer circuit 200 to the negative (−) output node (which may be connected to the negative input terminal of the transconductor Gm, for example). A first CK2 switch may connect the differential TXN signal from the TX buffer circuit 200 to the positive (+) output nod, and a second CK2 switch may connect the differential TXP signal from the TX buffer circuit 200 to the negative (−) output node.

A two-step operation may be performed to cancel the input offset of the transconductor Gm using the switch circuit 910. Example timing diagrams for the first step (Step #1) and the second step (Step #2) of the two-step operation are also shown in FIG. 9A.

In Step #1, the CK1 switches are closed, and the CK2 switches are open. In Step #2, the CK1 switches are open, and the CK2 switches are closed. In other words, the TXP and TXN inputs are swapped when comparing the first and second steps against each other.

As shown in the example timing diagram for Step #1 in FIG. 9A, the DCD programmable settings may be swept from a minimum to a maximum for each Clk cycle. At a first setting a1, the V2− voltage will transition from high ("1") to low ("0"). At a second setting a2, the V2+ voltage will transition from low to high. A first average setting "a" may then be computed as the average of a1 and a2; i.e. a=(a1+a2)/2.

Figure 11:
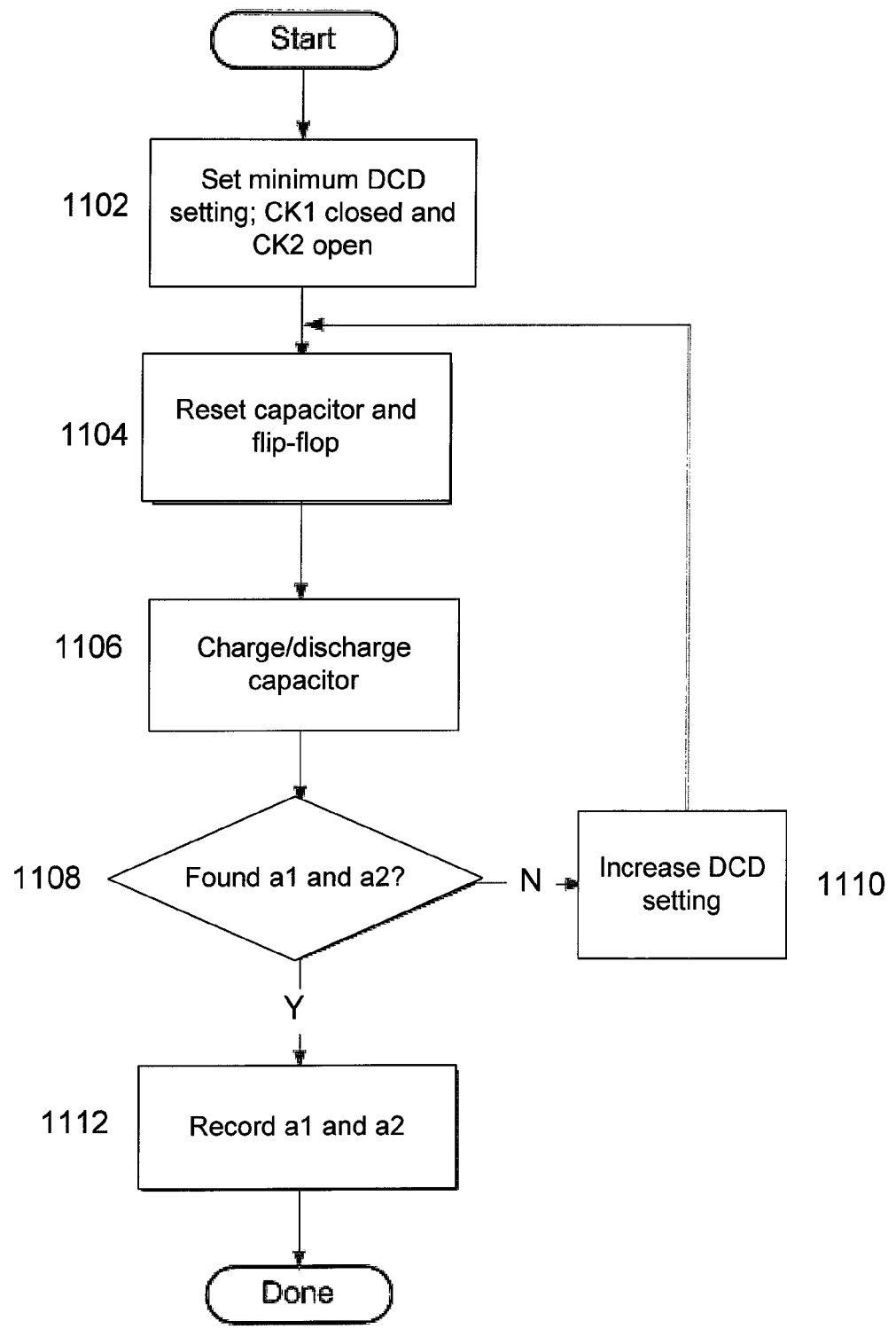
FIG. 11 is a flow chart of a procedure for a first step of a two-step operation using the switch circuit shown in FIG. 9A in accordance to an embodiment of the invention.

The flow chart in FIG. 11 illustrates an exemplary process for Step #1. Per the first block 1102, a minimum DCD setting is set. In addition, CK1 is closed, and CK2 is open. Per the second block 1104, the capacitor C and the flip-flop 302 may be reset. Per the third block 1106, the capacitor is allowed to be charged or discharged by the offset current. As described above, the V2− voltage transitions from high to low at the first setting a1, and the V2+ voltage transitions from low to high at the second setting a2. Per block 1108, a determination is made as to whether a1 and a2 have been found. If a1 and a2 have not yet been found, then the DCD setting is increased per block 1110 and the procedure loops back to perform block 1104. Once a1 and a2 have been found, then they are recorded (stored) per block 1112.

As shown in the example timing diagram for Step #2 in FIG. 9A, the DCD programmable settings may again be swept from a minimum to a maximum for each Clk cycle. At a first setting b1, the V2− voltage will transition from high ("1") to low ("0"). At a second setting b2, the V2+ voltage will transition from low to high. A second average setting "b" may then be computed as the average of b1 and b2 (i.e. b=(b1+b2)/2.

Figure 12:
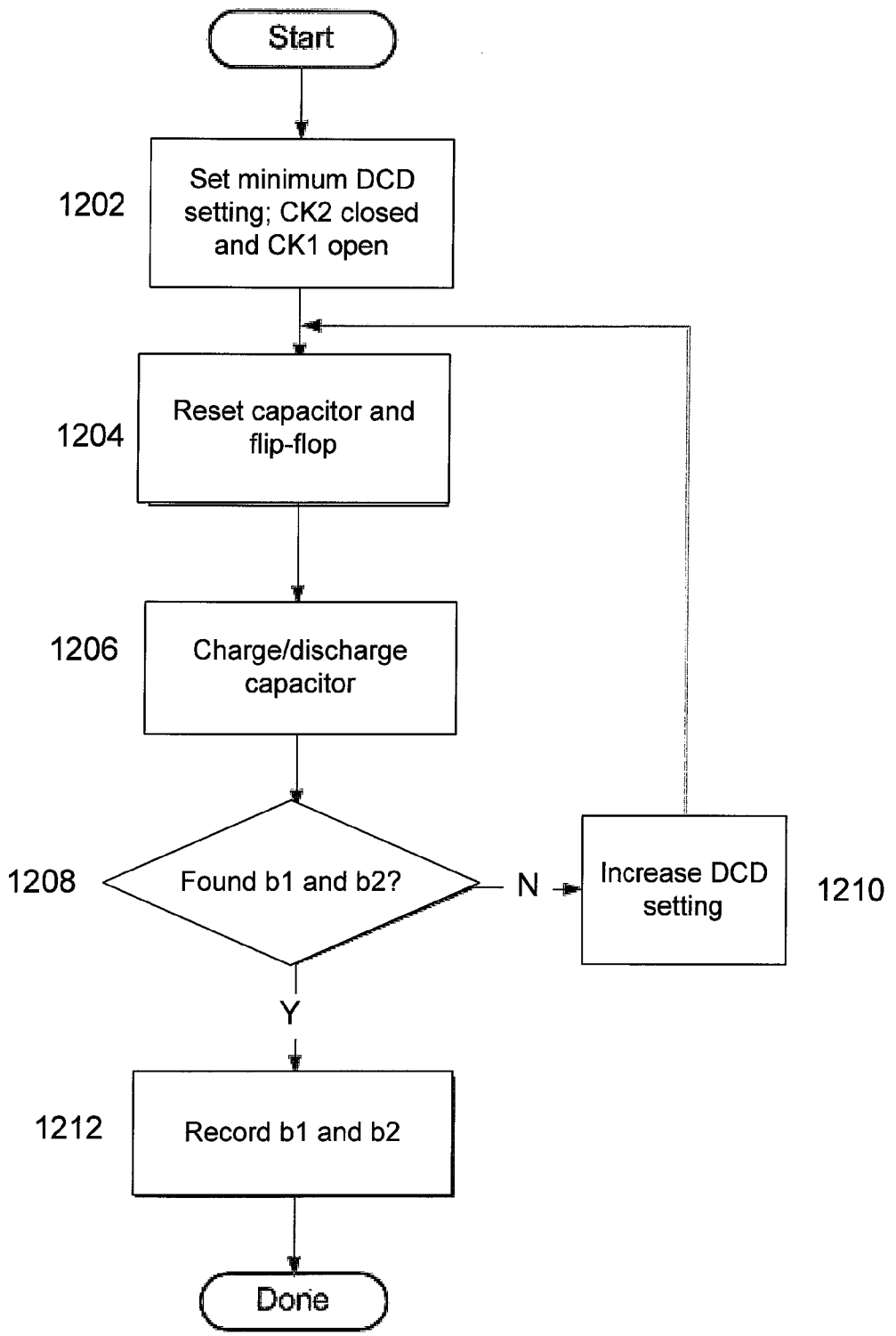
FIG. 12 is a flow chart of a procedure for a second step of a two-step operation using the switch circuit shown in FIG. 9A in accordance to an embodiment of the invention.

The flow chart in FIG. 12 illustrates an exemplary process for Step #2. Per the first block 1202, a minimum DCD setting is set. In addition, CK1 is open, and CK2 is closed. Per the second block 1204, the capacitor C and the flip-flop 302 may be reset. Per the third block 1206, the capacitor is allowed to be charged or discharged by the offset current. As described above, the V2− voltage transitions from high to low at the first setting b1, and the V2+ voltage transitions from low to high at the second setting b2. Per block 1208, a determination is made as to whether b1 and b2 have been found. If b1 and b2 have not yet been found, then the DCD setting is increased per block 1210 and the procedure loops back to perform block 1204. Once b1 and b2 have been found, then they are recorded (stored) per block 1212.

In accordance with an embodiment of the invention, an "optimum" setting "c" may be computed by averaging the first and second average settings (i.e. c=(a+b)/2).

FIG. 9B depicts a comparator and charge pump circuit 920 which may be used instead of a transconductance amplifier Gm in FIG. 3 in accordance with an embodiment of the invention. For example, the input of the circuit 920 may be connected to the differential output (TXP/TXN) from the TX buffer circuit 200, and the output of the circuit 920 may be connected to the Rst_n switch in FIG. 3.

When the output of the comparator (Comp) is high, the top current source $I_0$ is on, and the bottom current source $I_0$ is off, such that the load capacitor is being charged. On the other hand, when the output of the comparator is low, the top current source $I_0$ is off, and the bottom current source $I_0$ is on, such that the load capacitor is being discharged.

FIG. 9C depicts an inverter circuit 930 which may be used instead of the comparator circuit in FIG. 3 in accordance with an embodiment of the invention. As shown, the inverter circuit 930 may comprise a self-biased inverter.

When this circuit is reset, then switch Rst is closed, while switch Rst_n is open). In this mode, the input and the output of the first inverter are shorted together. The capacitor is then charged to the threshold voltage of the inverter (Vth).

During "normal" operation (detecting DCD distortion), switch Rst is open, while switch Rst_n is closed. In this mode, if voltage V1 is greater than Vth, then the output is logic high (indicating that the duty cycle is greater than 50%). On the other hand, if voltage V1 is less than Vth, then the output is logic low (indicating that the duty cycle is less than 50%).

Figure 10:
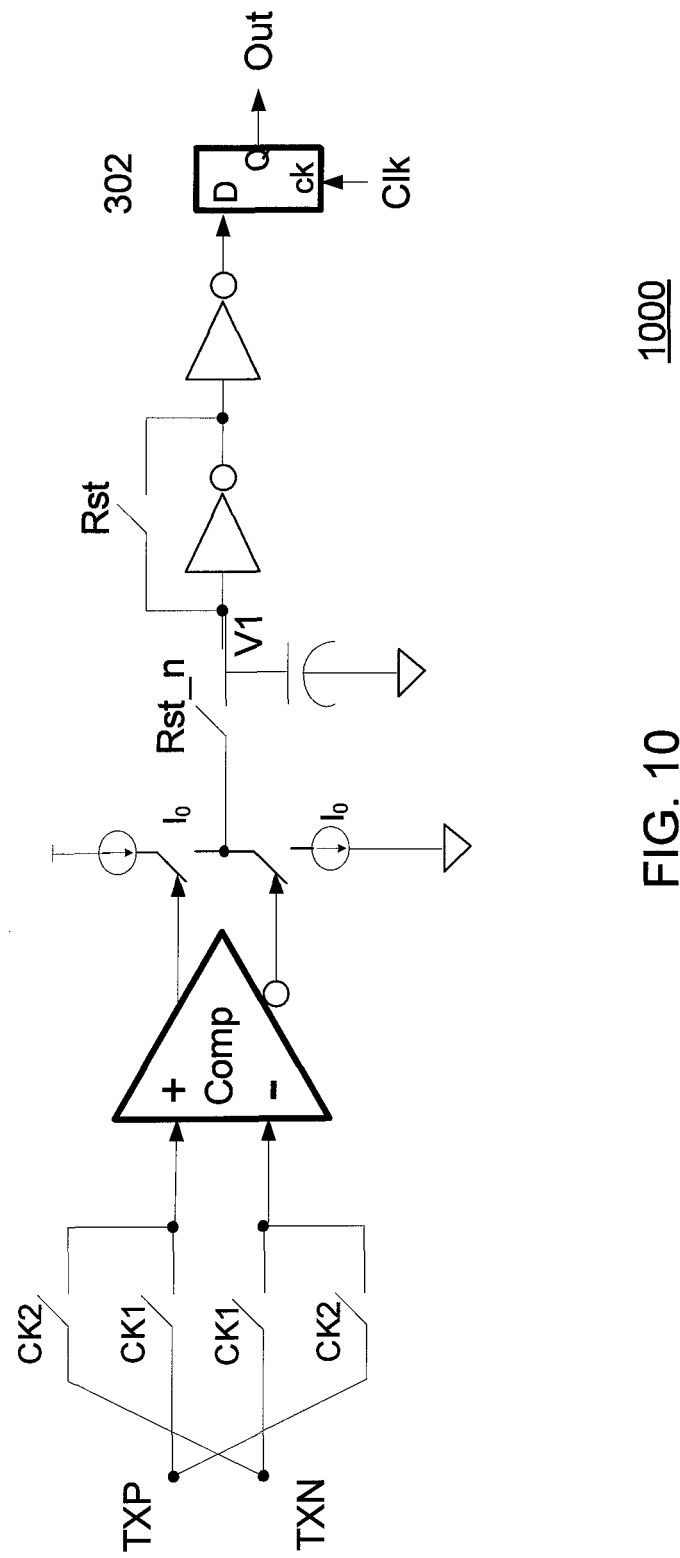
FIG. 10 shows a DCD distortion detection circuit which includes the circuits of FIGS. 9A-9C in accordance with an embodiment of the invention.

FIG. 10 shows a DCD distortion detection circuit 1000 which includes the circuits of FIGS. 9A-9C in accordance with an embodiment of the invention. The circuit 1000 receives the differential signal (TXP/TXN) from the TX buffer circuit 200 and provides its output from the flip-flop circuit 302. Note that while FIG. 10 effectively substitutes all three of the circuits of FIGS. 9A-9C for corresponding circuits in FIG. 3, other embodiments may substitute only one or two of the circuits of FIGS. 9A-9C for corresponding circuits in FIG. 3.

Figure 13:
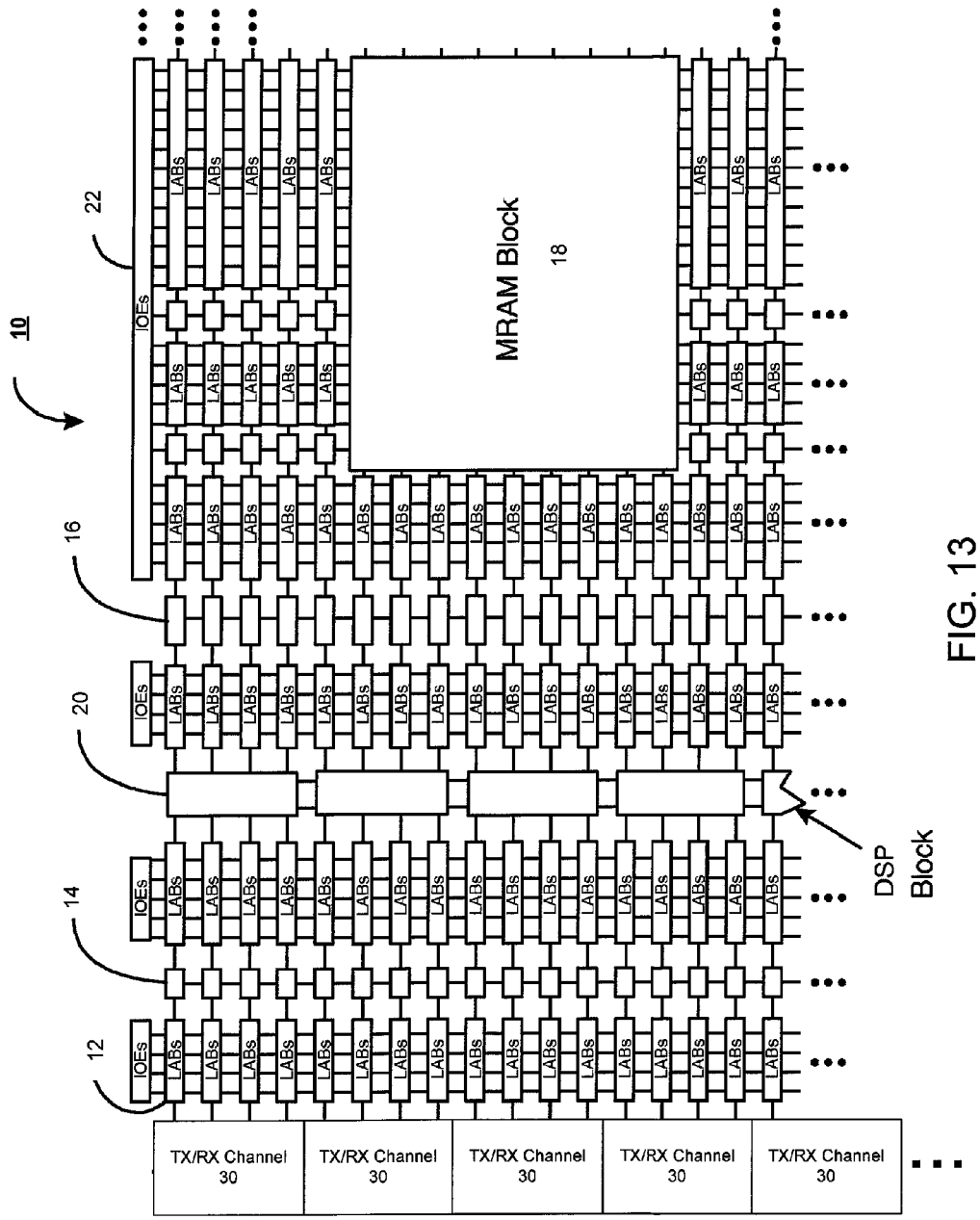
FIG. 13 is a simplified partial block diagram of a field programmable gate array (FPGA) that can include aspects of the present invention.

FIG. 13 is a simplified partial block diagram of a field programmable gate array (FPGA) 10 that can include aspects of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each 10E 22 is coupled to an external terminal (i.e., a pin) of FPGA 10. A transceiver (TX/RX) channel array may be arranged as shown, for example, with each TX/RX channel circuit 30 being coupled to several LABs. A TX/RX channel circuit 30 may include, among other circuitry, the transmitter circuitry described herein.

It is to be understood that FPGA 10 is described herein for illustrative purposes only and that the present invention can be implemented in many different types of PLDs, FPGAs, and ASICs.

Figure 14:
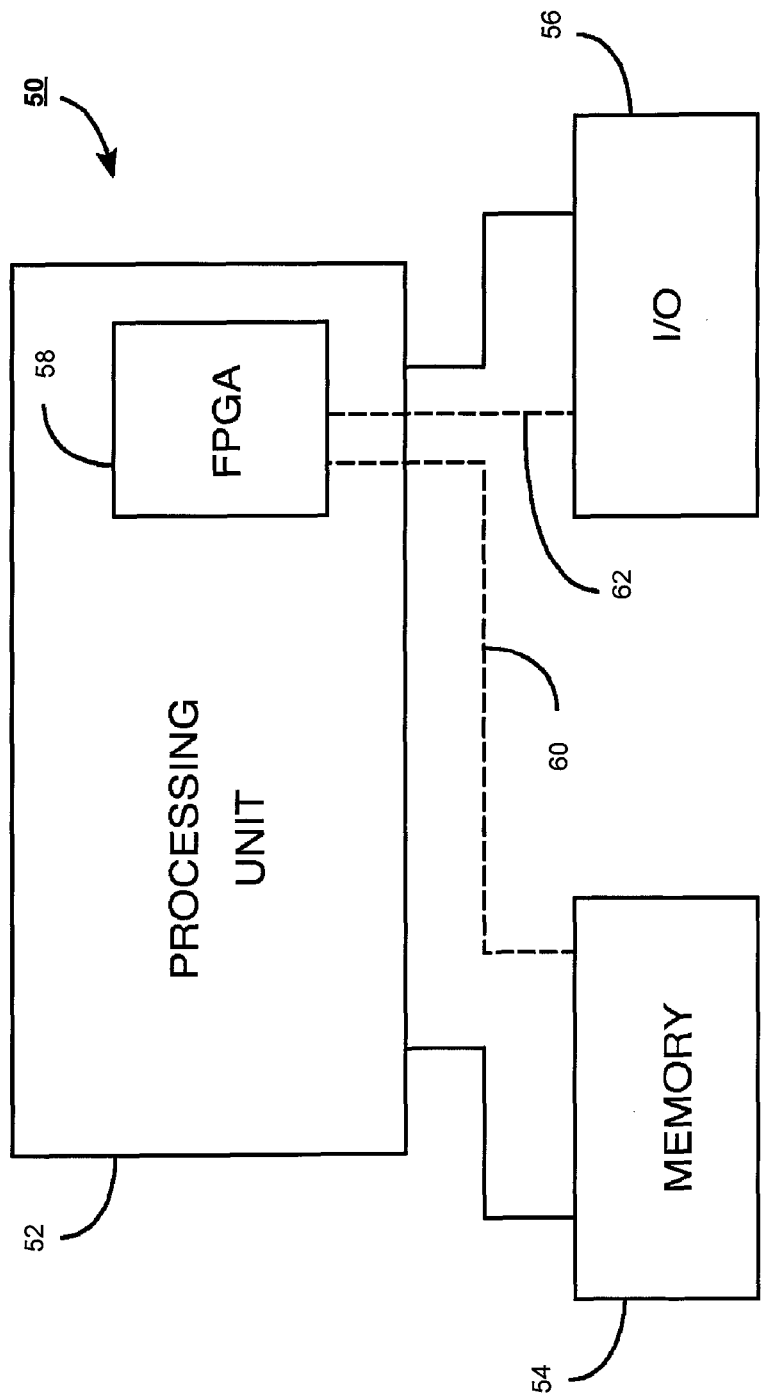
FIG. 14 is a block diagram of an exemplary digital system that can employ techniques of the present invention.

The present invention can also be implemented in a system that has a FPGA as one of several components. FIG. 14 shows a block diagram of an exemplary digital system 50 that can embody techniques of the present invention. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. An integrated circuit comprising:
    a transmitter buffer circuit configured to receive a serial input signal and generate a serial output signal;
    a duty cycle distortion detector configured to selectively couple to the serial output signal and generate detection signals;
    correction logic configured to receive the detection signals and generate duty cycle control signals; and
    a duty cycle adjuster configured to adjust a duty cycle of the serial input signal based on the duty cycle control signals.

2. The integrated circuit of claim 1, further comprising:
    a serializer configured to receive parallel data signals and generate the serial input signal.

3. The integrated circuit of claim 2, wherein the duty cycle adjuster is configured to use the duty cycle control signals to generate a clock signal which is utilized by the serializer to generate the serial input signal.

4. The integrated circuit of claim 2, wherein the duty cycle adjuster is configured to receive the serial input signal from the serializer and pre-distort the serial input signal before the serial input signal is received by the transmitter buffer circuit.

5. The integrated circuit of claim 1, wherein the serial input and output signals comprise differential data signals.

6. The integrated circuit of claim 5, wherein the duty cycle distortion detector comprises:
a transconductance amplifier;
a pair of switches configured to selectively couple the differential serial output signal to two inputs of the transconductance amplifier;
a capacitor configured between a voltage node and ground;
a charging/discharging switch configured to selectively couple an output of the transconductance amplifier to the voltage node; and
sampling circuitry configured to sample the voltage on the voltage node.

7. The integrated circuit of claim 6, wherein the sampling circuitry comprises:
a first comparator having a negative input coupled to a positive reference voltage, a positive input coupled to the voltage node, and a positive output;
a second comparator having a positive input coupled to a negative reference voltage, a negative input coupled to the voltage node; and a negative output;
a toggle circuit configured to receive the positive and negative outputs and generate a logical output, wherein the toggle circuit toggles the logical output if either the positive output is greater than the positive reference voltage or the negative output is less than the negative reference voltage; and
a flip-flop circuit configured to be triggered to hold the logical output.

8. The integrated circuit of claim 6, wherein the duty cycle distortion detector further comprises:
a switch configured to couple together the two inputs of the transconductance amplifier when the duty cycle distortion detector is in an offset detection mode.

9. The integrated circuit of claim 1, wherein the duty cycle control signals comprise fall-time and rise-time control signals.

10. The integrated circuit of claim 9, wherein the duty cycle adjuster comprises variable PMOS and NMOS inverters in series, wherein the variable PMOS inverters receive the rise-time control signals and the variable NMOS inverters receive the fall-time control signals.

11. The integrated circuit of claim 5, wherein the duty cycle distortion detector comprises:
a comparator and charge-pump circuit;
a switch circuit configured to selectively couple the differential serial output signal to two inputs of the transconductance amplifier;
a capacitor configured between a voltage node and ground;
a charging/discharging switch configured to selectively couple an output of the comparator and charge-pump circuit to the voltage node; and
sampling circuitry configured to sample the voltage on the voltage node.

12. The integrated circuit of claim 11, wherein the sampling circuitry comprises a self-biased inverter circuit.

13. A method of correcting duty cycle distortion in a transmitter, the method comprising:
buffering a serial input data signal by a buffer circuit to generate a serial output data signal;
detecting duty cycle distortion in the serial output data signal by a duty cycle distortion detector circuit;
generating duty cycle control signals based on the detected duty cycle distortion; and
adjusting a duty cycle of the serial input data signal based on the duty cycle control signals.

14. The method of claim 13, wherein the duty cycle of the serial input data signal is adjusted by changing a duty cycle of a clock signal used to generate the serial input data signal from parallel data signals.

15. The method of claim 13, wherein the duty cycle of the serial input data signal is adjusted by creating a pre-distorted version of the serial input data signal.

16. The method of claim 13, wherein the serial input and output signals comprise differential data signals.

17. The method of claim 16, wherein the duty cycle distortion is detected by:
inputting the differential serial data signal to a transconductor to generate an output current;
charging or discharging a capacitor using the output current; and
sampling a voltage on the capacitor after a known time period.

18. The method of claim 13, wherein the duty cycle control signals comprise fall-time and rise-time control signals.

19. The method of claim 18, wherein the rise-time control signals are used to control variable PMOS inverters and the fall-time control signals are used to control variable NMOS inverters, and wherein the PMOS and NMOS inverters are connected in a series.

20. A serial transmitter comprising:
a serializer configured to receive parallel data signals and generate a serial input signal.
a transmitter buffer circuit configured to receive the serial input signal and generate a serial output signal;
a duty cycle distortion detector configured to selectively couple to the serial output signal and generate detections signals;
correction logic configured to receive the detection signals and generate duty cycle control signals; and
a duty cycle adjuster configured to adjust a duty cycle of the serial input signal based on the duty cycle control signals.

21. The serial transmitter of claim 20, wherein the duty cycle adjuster is configured to use the duty cycle control signals to generate a clock signal which is utilized by the serializer to generate the serial input signal.

22. The serial transmitter of claim 20, wherein the duty cycle adjuster is configured to receive the serial input signal from the serializer and output a pre-distorted version of the serial input signal to the transmitter buffer circuit.

* * * * *